United States Patent
Tan et al.

(10) Patent No.: US 8,159,821 B2
(45) Date of Patent: Apr. 17, 2012

(54) DIFFUSION BONDING CIRCUIT SUBMOUNT DIRECTLY TO VAPOR CHAMBER

(75) Inventors: Kia Kuang Tan, Penang (MY); Wah Sheng Teoh, Penang (MY)

(73) Assignee: DSEM Holdings Sdn. Bhd., Penang (MY)

( * ) Notice: Subject to any disclaimer, the term of this patent is extended or adjusted under 35 U.S.C. 154(b) by 444 days.

(21) Appl. No.: 12/510,663

(22) Filed: Jul. 28, 2009

(65) Prior Publication Data

US 2011/0024086 A1 Feb. 3, 2011

(51) Int. Cl.
*H05K 7/20* (2006.01)
*B21D 53/02* (2006.01)
*F28D 15/00* (2006.01)
*F28F 7/00* (2006.01)

(52) U.S. Cl. ............... 361/700; 29/890.032; 165/104.33; 165/185; 361/704; 361/707; 361/719

(58) Field of Classification Search .................... 361/700
See application file for complete search history.

(56) References Cited

U.S. PATENT DOCUMENTS

| | | | |
|---|---|---|---|
| 6,625,022 B2 | 9/2003 | Frutschy et al. | |
| 7,098,486 B2 | 8/2006 | Chen | |
| 7,781,883 B2 * | 8/2010 | Sri-Jayantha et al. | 257/712 |
| 7,875,900 B2 * | 1/2011 | Meyer et al. | 257/99 |
| 2001/0032738 A1 * | 10/2001 | Dibene et al. | 174/260 |
| 2002/0196614 A1 * | 12/2002 | DiBene et al. | 361/803 |
| 2006/0196640 A1 | 9/2006 | Siu | |
| 2007/0090737 A1 | 4/2007 | Hu et al. | |
| 2007/0295486 A1 | 12/2007 | Su et al. | |
| 2008/0040925 A1 | 2/2008 | Lee et al. | |
| 2008/0044949 A1 * | 2/2008 | Colbert et al. | 438/118 |
| 2009/0140417 A1 * | 6/2009 | Refai-Ahmed | 257/707 |
| 2010/0038660 A1 * | 2/2010 | Shuja | 257/98 |

* cited by examiner

*Primary Examiner* — Gregory Thompson
(74) *Attorney, Agent, or Firm* — Patent Law Group LLP; Brian D. Ogonowsky

(57) ABSTRACT

A method for providing a high in-plane and through-plane thermal conductivity path between a heat producing electronic device and a heat sink is described. A vapor chamber, or other type of heat spreader, is provided that has a substantially flat top copper surface and a substantially flat bottom copper surface. A ceramic submount is also provided, where the submount has a top copper metallization layer patterned for connection to electrodes of a heat-producing die, and where the submount has a bottom copper metallization layer. Prior to a working fluid being introduced into the vapor chamber, and prior to a die being mounted on the submount, the top copper surface of the vapor chamber is diffusion bonded to the bottom copper metallization layer of the ceramic submount under heat and pressure. The working fluid is then introduced into the vapor chamber, and the chamber is sealed. Dies are then mounted on the submount. The bottom of the vapor chamber is then affixed over a heat sink.

38 Claims, 4 Drawing Sheets

DIFFUSION BONDING CIRCUIT SUBMOUNT DIRECTLY TO VAPOR CHAMBER

FIELD OF THE INVENTION

This invention relates to thermal management of electronic circuits and, in particular, to a technique for providing high in-plane and through-plane thermal conductivities between an electronic device (e.g., a semiconductor chip), and a heat sink.

BACKGROUND

High-power light emitting diodes, microprocessors, and other compact, high heat generating electronic devices need to be mounted on a thermally conductive substrate that is ultimately thermally connected to a heat sink. The best thermal path to the heat sink is through an all-metal path. However, a polymer dielectric layer typically exists between the electronic device and the heat sink for providing electrical isolation between the device electrodes and the heat sink. To avoid the polymer dielectric layer, it is known to directly bond a copper interconnect layer to an insulating ceramic substrate (e.g., $Al_2O_3$ or AlN), where the electronic device is mounted on the copper interconnect layer, and where a small-area metalized bottom surface of the ceramic substrate is soldered to a relatively large metal plate for mechanical mounting (e.g., via bolts) to a heat sink. The large metal plate helps to spread heat laterally across the heat sink for increased heat removal and provides a means for attaching the ceramic substrate to the heat sink. Such a ceramic substrate is known as a direct bonded copper (DBC) substrate. The thermal conductivity of a thin ceramic substrate is much greater than that of a polymer layer. The metal plate is bolted to a heat sink, with a thermally conductive thermal grease between the plate and heat sink to ensure full thermal contact. A thermal grease typically is infused with metal (e.g., silver) for high thermal conductance.

In applications where there is a need for even further thermal control, the electronic device is thermally coupled to the top surface of a vapor chamber for increased spreading of heat, and the bottom surface of the vapor chamber is affixed to a heat sink. By spreading the heat, the overall thermal resistance is reduced. Vapor chambers typically provide greater 30% more heat spreading than a solid metal plate. Heat spreaders other than a vapor chamber may be used.

A vapor chamber is a thin closed metal chamber, typically formed of copper, with flat top and bottom surfaces. The chamber contains a small quantity of a working fluid, such as water, under a partial vacuum. The chamber also contains a wick. The heat source is thermally coupled to the top surface, and the bottom surface is thermally coupled to a heat sink. The heat source vaporizes the water in the chamber near the top surface to create a phase change. The vapor is then cooled at the bottom surface and turns into a liquid. This creates a pressure differential that speeds up the movement of the liquid back to the top surface by capillary action through the wick. The flowing of the liquid/vapor inside the vapor chamber helps spreads the heat in two dimensions across the vapor chamber area (in-plane spreading) and the heat is conducted in a vertical direction (through-plane) to the heat sink. By spreading the heat over a relatively large area (compared to the size of the electronic device), the thermal resistance between the electronic device and the heat sink is reduced.

Further details of vapor chambers are described in US Publication Nos. 2006/0196640, 2007/0295486, and 2008/0040925, and U.S. Pat. No. 7,098,486, all incorporated herein by reference.

It is known to affix a metal core printed circuit board (MCPCB) to the top surface of a vapor chamber, such as by a thermally conductive epoxy, but any polymer dielectric layer over the circuit board increases thermal resistance, and the epoxy is not as good of a heat conductor as metal. It is also known to directly solder LED chips to the top surface of the vapor chamber (U.S. Pat. No. 7,098,486) and use the metal of the vapor chamber as an electrode, but this technique has many drawbacks, such as requiring special equipment to connect the delicate electrodes of the LEDs to other than the standard circuit board or submount.

If the electronic devices were first mounted on a conventional circuit board or ceramic submount, and the back surface of the relatively large circuit board or submount were somehow soldered directly to the top surface of the vapor chamber, voids in the solder layer under the board or submount may develop due to the relatively large surface area being soldered. Typically, the board or submount would be soldered only around the edges. Further, a solder reflow technique (typically used for surface mount devices) could not be used since it would subject the fluid in the vapor chambers to temperatures around 230° C., which exceeds the typical maximum allowable temperature for the vapor chamber. Therefore, any soldering to the vapor chamber must be done by other than surface mounting technology solder reflow.

What is needed is an improved technique for thermally coupling a heat generating electronic device, such as one or more high power LEDs or a microprocessor, to a top surface of a vapor chamber, and thermally coupling the vapor chamber to a heat sink.

SUMMARY

In the non-electronic field of mechanically connecting two metal pieces together, it is known to use solid state diffusion bonding (SSDB). In SSDB, two metals are pressed together at a temperature below but near the melting points of the metals. Over time, the metal atoms of one piece diffuse into the other piece to create a very strong bond.

According to Kazakov N. F, "Diffusion Bonding of Materials", Pergamon Press (1985, English version), diffusion bonding of materials in the solid state is a process for making a monolithic joint through the formation of bonds at the atomic level, as a result of closure of the mating surfaces due to the local plastic deformation at elevated temperature which aids interdiffusion at the surface layers of the materials being joined.

In SSDB, there are no joint discontinuities and no porosity in the joint if the mating surfaces are sufficiently polished prior to the SSDB process.

Applicants have discovered that a very low resistance thermal connection can be made between the copper bottom metallization of a DBC ceramic submount and the copper top surface of a vapor chamber. The mating surfaces must be polished to be very flat. Oxidation of the copper surfaces is not a problem since the SSDB method breaks any thin oxide layer and creates a good copper-copper bond. SSDB bonding to an aluminum surface is also an option with the present invention, although copper is a better thermal conductor.

In one embodiment, one or more DBC ceramic submounts are provided to the vapor chamber manufacturer without the electronic devices mounted on the submounts. The ceramic submounts are typically custom designed for ultimately having mounted thereon specified electronic devices (e.g., an LED or microprocessor) using the device manufacturer's standard equipment.

The bottom metallization of the submount and the surface of the vapor chamber are both copper. Since the temperature needed to bond two copper surfaces using SSDB is much greater than the maximum allowable temperature of the vapor chamber containing the working fluid, the working fluid is not introduced into the vapor chamber until the SSDB process is finished.

In one embodiment, the mating surfaces are first mechanically polished. The SSDB process is then performed in a high vacuum at a temperature between 500°-1000° C. (preferably 700°-800° C.), and a pressure of about 500 psi (3.45 MPa) is applied to the opposing surfaces. A lower pressure may be used with a higher temperature.

In another embodiment, the copper metallization on the DBC submount is gold plated. The mating area on the top surface of the vapor chamber is also gold plated. The mating gold layers can be diffusion bonded at a lower temperature than required for copper-to-copper bonding. Any metal-to-metal diffusion bonding is possible with the invention and is not restricted to only copper-to-copper bonding.

Since the SSDB process is performed prior to the electronic device (e.g., a die or other device) being mounted on the submount, there is no damage to the die due to the high temperature and pressure.

The working fluid is then injected into the vapor chamber via a small metal pipe, and the chamber is sealed by crimping the pipe. The bonded vapor chamber and submount is then provided to the die manufacture for mounting the die(s) to the submount's top metallization pattern. The die and circuit pattern may be tested prior to the die being bonded to the submount. There is no thermal interface materials other than metal and the ceramic submount. There are no voids at the mating surfaces.

In another embodiment, a metal heat spreader other than a vapor chamber is diffusion bonded to the bottom metallization of the DBC submount. Such a metal heat spreader may a relatively thick solid copper plate or other metal plate. The mating surfaces may be plated with gold for ease of diffusion bonding.

Other embodiments are described.

BRIEF DESCRIPTION OF THE DRAWINGS

Elements labeled with the same numerals in the various figures are the same or equivalent.

DETAILED DESCRIPTION

Figure 1:
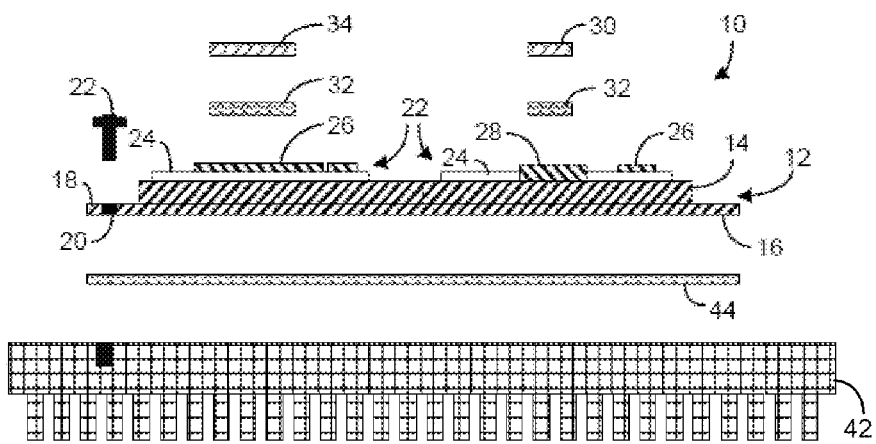
FIG. 1 is an exploded cross-sectional view of a completed assembly taken along line 1-1 of FIG. 2, where the vapor chamber is bolted to the heat sink with a thermal grease (or other thermal interface layer) between the chamber and heat sink for better thermal contact.
Figure 2:
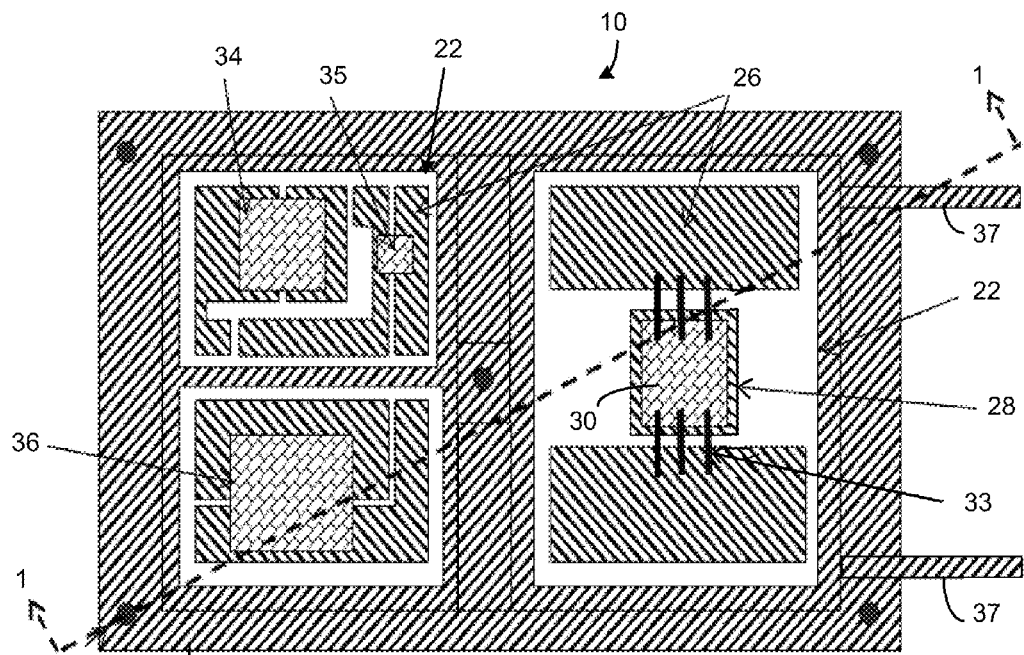
FIG. 2 is a top down view of the assembly of FIG. 1, but without the heat sink, showing three separate ceramic submounts diffusion bonded to the copper top surface of the vapor chamber, with dies mounted to the metal pattern formed on the submounts.
Figure 3:
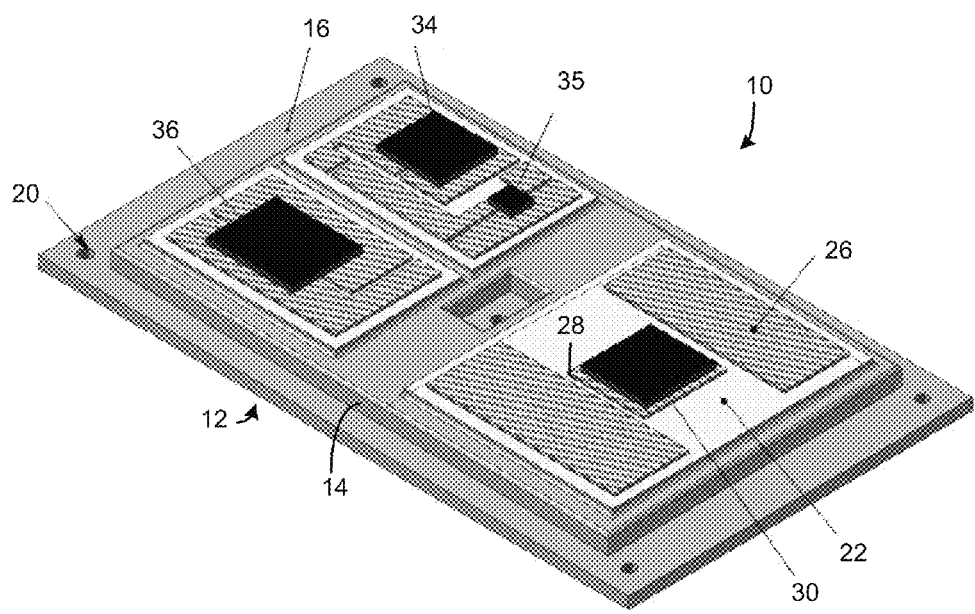
FIG. 3 is a top perspective view of the assembly of FIG. 2.

FIGS. 1, 2, and 3 illustrate different views of the same assembly 10, where only FIG. 1 shows the heat sink. A vapor chamber 12 is provided, typically by a first manufacturer, such as Taiwan Microloops Corp (www.microloops.com). The vapor chamber 12 may have any shape although it is usually on the order of 3-5 mm thick and has a maximum size of 400×400 mm. In one embodiment, the vapor chamber 12 has a top shell 14 and a bottom plate 16, both typically stamped copper, welded together. The top shell 14 forms a cavity when mated with the bottom plate 16. In one embodiment, the top shell 14 and bottom plate 16 are diffusion bonded together at the same time that a submount is diffusion bonded to the top shell 14, described later. The top and bottom surfaces of the vapor chamber 12 are flat. The bottom plate 16 has flanges 18 with bolt holes 20 for affixing the vapor chamber 12 to a heat sink by bolts 22 (e.g., five bolts).

Inside the chamber 12 is a wicking material. At a corner of the chamber 12, a short copper fill pipe (not shown) extends out, which is used for introducing a small amount of the working fluid (e.g., water) under a vacuum at the appropriate time. The wick may be a copper mesh, sintered metal beads, or other suitable wick for causing the working fluid to move to the heat source side by capillary action. Many types of vapor chambers are suitable for use with the invention and need not be described in detail. Some suitable vapor chambers are described in US Publication Nos. 2006/0196640, 2007/0295486, and 2008/0040925, and U.S. Pat. No. 7,098, 486, all incorporated herein by reference.

A ceramic submount 22 having a body 24 formed of, for example, $Al_2O_3$, AlN, AlSiC, or other suitable material, is provided with a direct bonded copper layer 26 on its top and bottom surfaces and, in the example of FIG. 1, provided with a copper portion 28 that extends completely through an opening in the ceramic. DBC ceramic substrates with thermal conductivities of at least 24 W/mK-27 W/mK are commercially available in any size and down to about 0.25 mm thickness. A preferred thickness is between 0.25-1 mm. Ceramic substrate vendors directly bond a copper layer to the surfaces of the ceramic body having any specified pattern. Direct bonding is typically performed by pressing a copper foil against the ceramic surface and heating the structure to 1070° C. (close to the melting point of copper) in a pure $N_2$ atmosphere. After cooling, the copper foil is then etched to create the desired metal pattern.

In the various embodiments described herein, the entire back surface of the ceramic submount 22 is coated with a copper layer, and the top surface is has formed on it a copper pattern that is customized for the particular electronic device electrode pattern and interconnections specified by the designer. At least the bottom copper layer may be plated with gold. FIGS. 2 and 3 show the top copper pattern for each of the submounts 22. The top and bottom metal is electrically isolated by the electrically insulating ceramic. The copper portion 28 that extends through the ceramic body 24 in FIG. 1 is a thermal pad that directly attaches to an electrically isolated thermal pad on the back surface of the electronic device, such as a high power LED die.

Prior to the working fluid being introduced into the vapor chamber 12 and prior to the electronic devices being mounted on the submounts 22, the bottom copper layer on the submounts 22 is diffusion bonded (using a SSDB process) to the copper top surface of the vapor chamber 12. The mating surfaces are first mechanically polished so that there is substantially uniform contact over the entire area of the mating surfaces.

The melting point of copper is about 1084° C. The copper layers described herein include copper alloy layers whose melting points may differ from that of pure copper. The vapor chamber 12 and submounts 22 are placed in a vacuum chamber, and the temperature is raised to at least 700° C. The vapor chamber 12 and submounts 22 are then mechanically pressed together by a suitable press so that the mating copper surfaces experience a pressure of, for example, 500 psi (3.45 MPa) for diffusion bonding of the copper. The required temperature and/or pressure can be lower if the mating surfaces were plated with gold. Ideally, the top copper layer 26 covers a majority of the ceramic submount surface so that the pressure against the top copper layer 26 exerts a high pressure against the entire mating surfaces for good diffusion bonding. Lower pressures along with higher temperatures may be used to achieve suitable diffusion bonding. After an appropriate time, there will be sufficient diffusion of atoms across the mating interface to form a bond essentially as strong as the bulk material with no discontinuities and no porosity. To Applicants' knowledge, diffusion bonding has never been performed for the purpose of increasing the thermal conductivity between an electronic device and a vapor chamber while providing circuitry on the vapor chamber for device interconnects.

In one embodiment, the diffusion bonding step also diffusion bonds the top shell 14 and bottom plate 16 of the vapor chamber 12 together.

The coefficient of thermal expansion (CTE) of a ceramic submount is very low so there will not be much stress on the metal interface during operation of the electronic devices, and there will be very little stress between the semiconductor dies and the submounts.

After the diffusion bonding, any complex metal interconnection patterns may be tested for shorts or open circuits.

The working fluid is then introduced into the vapor chamber 12 via the copper inlet pipe under a partial vacuum, and the pipe is then crimped and cut to seal the container.

The structure is then shipped to the die manufacturer or assembler for attachment of the dies to the submounts 22. The submounts 22 may be conventional, so the assembler does not need any special equipment for the die attachment. In the example of FIGS. 2 and 3, the die 30 has an electrically insulated bottom thermal pad that is soldered to the copper portion 28 in FIG. 1 by a suitable solder 32 (or other metal based adhesive), and has electrodes connected to the submount's patterned top copper layer 26 by wires 33. Other wires (not shown) may connect the copper layer 26 pads to a power supply or to other devices on the same vapor chamber 12.

The other dies 34, 35, and 36 are flip chips with only bottom electrodes directly bonded to the patterned copper layer 26 on their customized submounts 22. There may be any number of dies mounted on a single submount 22 interconnected by the top copper layer 26, and there may be any number of submounts 22, including only one, diffusion bonded to the vapor chamber 12.

The heat sources may be any electronic device (e.g., a resistor) and not limited to dies.

The vapor chamber 12 is then bolted to a heat sink 42 (e.g., aluminum or copper) with a suitable metal-based thermally conductive layer 44 in-between. The thermally conductive layer 44 may be a thin layer of thermal grease (containing metal particles) that ensures complete thermal contact over the entire mating surfaces. Thermal grease is also referred to as thermal paste, thermal compound, and other names.

If a remote heat sink is used, the vapor chamber 12 may be connected to the remote heat sink by heat pipes 37, shown in FIG. 2.

Accordingly, there is a high in-plane and through-plane thermal conductivity path between the dies and the heat sink with no polymer dielectric layer or FR4 (resin epoxy) layer in the path. The heat from each die is conducted through only the copper layers on the top and bottom of the ceramic submount, through the high conductivity ceramic (except where the copper portion 28 exists), through the copper vapor chamber 12 (which spreads the heat), and into a metal heat sink via a metal interface layer. At least the submount/vapor chamber interface is diffusion bonded, allowing the submount to be made any size without any discontinuities or porosity in the interface. All circuits may be tested prior to the dies being mounted on the vapor chamber 12.

Figure 4:
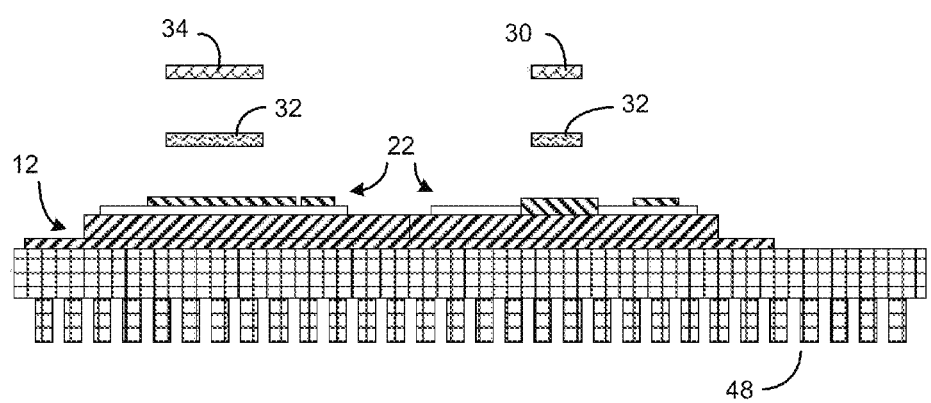
FIG. 4 is an exploded cross-sectional view of another completed assembly, where the bottom surface of the vapor chamber is diffusion bonded to the top surface of the heat sink to eliminate the need for bolting the chamber to the heat sink and to improve thermal conductivity.

FIG. 4 illustrates another embodiment, where the heat sink 48 preferably has a plated top copper layer (such as performed in an ALOX™ process), and the bottom copper surface of the vapor chamber 12 is diffusion bonded to the heat sink 48 during the same diffusion bonding process used to bond the submounts 22 to the vapor chamber 12. Both mating surfaces must first be polished. ALOX™ is a trade name coined by Micro Components, Ltd to identify an aluminum substrate with an oxidized surface portion and a copper layer (or other metal layer to aid soldering) deposited on the oxidized surface. Device Semiconductor Sdn. Bhd. (DSEM) is a licensee of the ALOX™ process. Forming ALOX™ substrates is described in US patent application publication US 2007/0080360 and PCT International Publication Number WO 2008/123766, both incorporated herein by reference.

Figure 5:
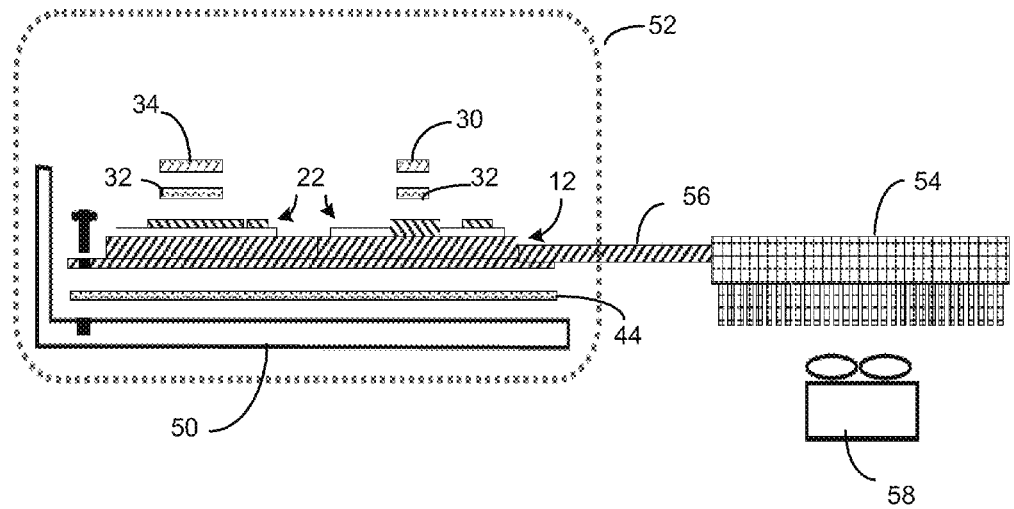
FIG. 5 illustrates an embodiment similar to FIG. 1 except the vapor chamber is connected via a heat pipe to a remote heat sink.

FIG. 5 illustrates the same assembly described with respect to FIG. 1, but the vapor chamber 12 is bolted to a support structure 50 in an enclosure 52 (e.g., a cabinet) and connected to a heat sink 54 (or a heat exchanger) by a conventional heat pipe 56. Heat pipes use the vaporization of water by the heat source, followed by condensation on a colder surface, followed by capillary action of the liquid back to the heat source to transfer heat and are well known. A fan 58 may be used to aid in the cooling of the heat sink 54.

Figure 6:
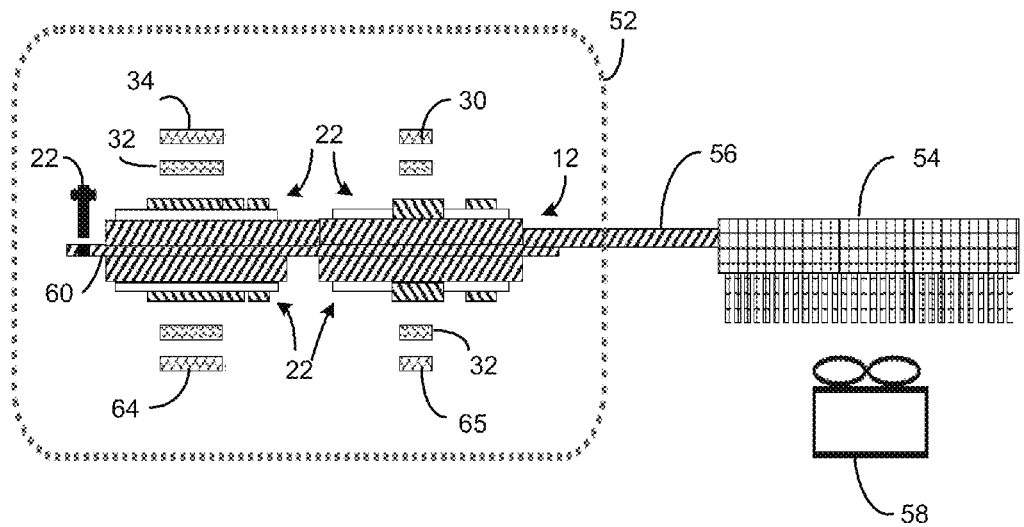
FIG. 6 is similar to FIG. 5 except submounts are diffusion bonded to both the top and bottom surfaces of the vapor chamber.

FIG. 6 is similar to FIG. 5 but submounts 22 are diffusion bonded to both sides of a vapor chamber 12 during the same bonding process. In FIG. 6, the vapor chamber 12 is actually formed by back-to-back vapor chambers using a common middle plate 60. Additional dies 64 and 65 are connected to the submounts 22 on the bottom surface of the vapor chamber 12.

Figure 7:
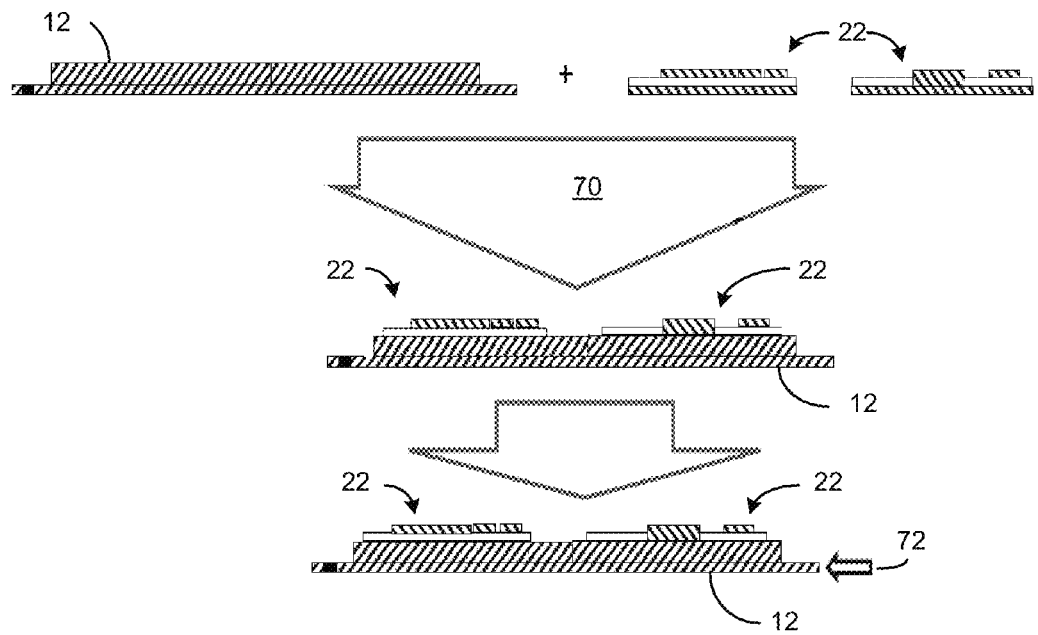
FIG. 7 illustrates the basic process of the substrate/submount manufacturer providing DBC substrates/submounts to a vapor chamber manufacturer, who then performs the diffusion bonding. A die manufacturer would then mount dies to the metallization pattern on the substrates/submounts in a conventional manner.

FIG. 7 is a simplified diagram of the manufacturing process, where the vapor chamber manufacturer supplies a vapor chamber 12 without working fluid, and the substrate manufacturer provides the DBC ceramic substrates (submounts 22) customized for the electronic devices to be mounted. The vapor chamber manufacturer then diffusion bonds the copper bottom layer of the submounts 22 to the vapor chamber 12 using pressure and heat 70 and then introduces the working fluid 72 into the vapor chamber 12 after the chamber 12 is cooled. The vapor chamber 12 is then shipped to the assembler for mounting the dies onto the submounts 22 in a conventional manner.

Figure 8:
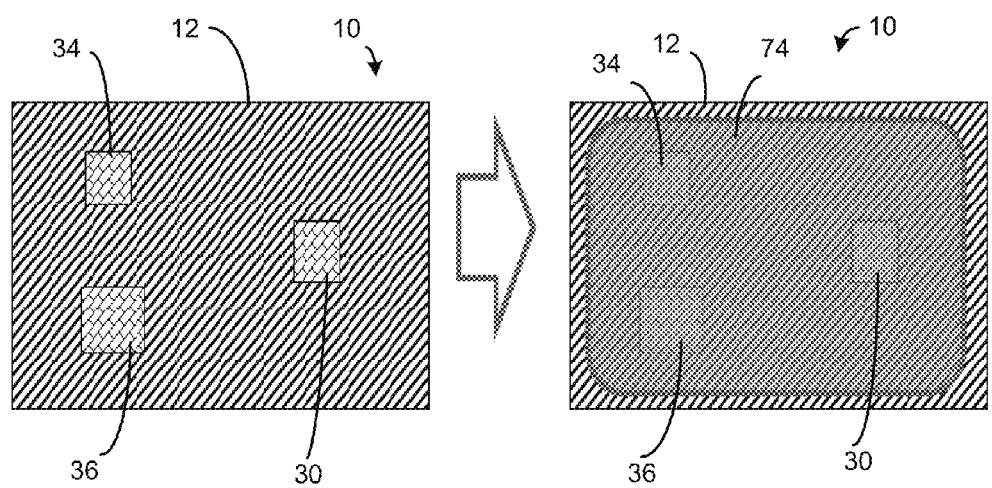
FIG. 8 illustrates the in-plane spreading of the heat from the three heat sources in FIG. 2 throughout the vapor chamber.

FIG. 8 illustrates the in-plane heat spreading 74 performed by the vapor chamber 12 for three dies 30, 34, and 36 mounted on submounts. Had the submounts been soldered to an ordinary metal core printed circuit board and the board been bolted to an ordinary heat sink, the heat would be more localized around each die, creating hot spots.

In another embodiment, the bottom metallization layer of the submount is diffusion bonded to a solid flat metal plate rather than a vapor chamber, where the metal plate is used for heat spreading and as an interface for attachment to a heat sink. Suitable metal plates include copper, aluminum, and their alloys. The metal plate has bolt holes for bolting to a metal heat sink with a thermal paste in-between, or the metal plate may be directly diffusion bonded to the heat sink. So, in all the figures and described methods, the numeral 12 may refer to a metal plate rather than the vapor chamber. Any of the mating surfaces (including the heat sink mating surface) may be plated with gold or another metal for facilitating diffusion bonding.

Therefore, the invention creates a heat spreader (e.g., vapor chamber or thick metal plate) having diffusion bonded thereon one or more thermally efficient electronic substrates ready for die (or other device) attachment using conventional die attachment equipment, where the heat spreader is configured to be thermally coupled to a heat sink. The thermal properties are inherently better than prior art coupling techniques.

Having described the invention in detail, those skilled in the art will appreciate that given the present disclosure, modifications may be made to the invention without departing from the spirit and inventive concepts described herein. Therefore, it is not intended that the scope of the invention be limited to the specific embodiments illustrated and described.

What is claimed is:

1. A method for providing a high in-plane and through-plane thermal conductivity path between a heat producing electronic device and a heat sink comprising:
    providing a vapor chamber having a substantially flat top metal surface and a substantially flat bottom metal surface, the vapor chamber for being thermally coupled to a heat sink;
    providing at least one insulating body for mounting on its top surface at least one heat producing electronic device, the at least one insulating body having a top metallization layer patterned for connection to electrodes of the at least one electronic device, the at least one insulating body having a bottom metallization layer; and
    diffusion bonding the bottom metallization layer of the at least one insulating body to the top metal surface of the vapor chamber under heat and pressure.

2. The method of claim 1 further comprising soldering the at least one electronic device to the top metallization layer on the insulating body after the step of diffusion bonding.

3. The method of claim 1 wherein the top metallization layer extends through an opening in the insulating body to directly contact the bottom metallization layer.

4. The method of claim 1 further comprising affixing the bottom metal surface of the vapor chamber to a heat sink.

5. The method of claim 1 further comprising diffusion bonding the bottom metal surface of the vapor chamber to a top surface of a heat sink.

6. The method of claim 1 wherein the at least one insulating body comprises a plurality of insulating bodies, the method further comprising diffusion bonding the bottom metallization layer of another of the insulating bodies to the bottom metal surface of the vapor chamber under heat and pressure.

7. The method of claim 6 wherein the vapor chamber comprises back-to-back vapor chambers.

8. The method of claim 1 wherein there is only metal or ceramic in a thermal path between the top metallization layer of the at least one insulating body and the top metal surface of the vapor chamber, where the bottom metallization layer of the insulating body is substantially completely bonded by diffusion to the top metal surface of the vapor chamber.

9. The method of claim 1 further comprising affixing the bottom metal surface of the vapor chamber to a top surface of a heat sink using bolts.

10. The method of claim 1 wherein the vapor chamber comprises a copper shell and a copper plate, wherein the step of diffusion bonding also diffusion bonds edges of the copper shell to the copper plate.

11. The method of claim 1 wherein the at least one insulating body has the top metallization layer patterned to interconnect two or more dies together.

12. The method of claim 1 wherein the top surface of the at least one insulating body has a majority of its area covered by the top metallization layer.

13. The method of claim 1 wherein the at least one insulating body comprises a plurality of insulating bodies, all having their bottom metallization layer simultaneously diffusion bonded to the vapor chamber's top metal surface during the step of diffusion bonding.

14. The method of claim 1 wherein at least the bottom metallization layer of the at least one insulating body comprises copper or a copper alloy.

15. The method of claim 1 further comprising thermally connecting the vapor chamber to a remote heat sink.

16. The method of claim 1 further comprising polishing the bottom metallization layer of the at least one insulating body and the top metal surface of the vapor chamber prior to the step of diffusion bonding.

17. An intermediate assembly during fabrication comprising:
    a vapor chamber having a substantially flat top metal surface and a substantially flat bottom metal surface, the vapor chamber for being thermally coupled to a heat sink, the vapor chamber not containing a working fluid;
    at least one ceramic submount for mounting on its top surface at least one heat producing electronic device, the at least one ceramic submount having a top metallization layer patterned for connection to electrodes of the at least one electronic device, the at least one ceramic submount having a bottom metallization layer; and
    the bottom metallization layer of the at least one ceramic submount being diffusion bonded to the top metal surface of the vapor chamber under heat and pressure without the working fluid being in the vapor chamber.

18. The assembly of claim 17 wherein the bottom metallization layer of the at least one ceramic submount comprises copper or a copper alloy.

19. An assembly comprising:
    a vapor chamber having a substantially flat top metal surface and a substantially flat bottom metal surface, the vapor chamber for being thermally coupled to a heat sink;
    at least one insulating body, the at least one insulating body having a top metallization layer connected to electrodes of at least one electronic device, the at least one insulating body having a bottom metallization layer; and the bottom metallization layer of the at least one insulating body being diffusion bonded to the top metal surface of the vapor chamber under heat and pressure.

20. The assembly of claim 19 further comprising a heat sink thermally connected to the vapor chamber.

21. A method for providing a high in-plane and through-plane thermal conductivity path between a heat producing electronic device and a heat sink comprising:

providing a metal heat spreader having a substantially flat top metal surface and a substantially flat bottom metal surface, the heat spreader for being thermally coupled to a heat sink;

providing at least one insulating body for mounting on its top surface at least one heat producing electronic device, the at least one insulating body having a top metallization layer patterned for connection to electrodes of the at least one electronic device, the at least one insulating body having a bottom metallization layer; and diffusion bonding the bottom metallization layer of the at least one insulating body to the top metal surface of the heat spreader under heat and pressure.

22. The method of claim 21 further comprising soldering the at least one electronic device to the top metallization layer on the insulating body after the step of diffusion bonding.

23. The method of claim 21 further comprising affixing the bottom metal surface of the heat spreader to a heat sink.

24. The method of claim 21 further comprising diffusion bonding the bottom metal surface of the heat spreader to a top surface of a heat sink.

25. The method of claim 21 wherein the at least one insulating body comprises a plurality of insulating bodies, the method further comprising diffusion bonding the bottom metallization layer of another of the insulating bodies to the bottom metal surface of the heat spreader under heat and pressure.

26. The method of claim 21 wherein there is only metal or ceramic in a thermal path between the top metallization layer of the at least one insulating body and the top metal surface of the heat spreader, where the bottom metallization layer of the insulating body is substantially completely bonded by diffusion to the top metal surface of the heat spreader.

27. The method of claim 21 further comprising affixing the bottom metal surface of the heat spreader to a top surface of a heat sink using bolts.

28. The method of claim 21 wherein the at least one insulating body has the top metallization layer patterned to interconnect two or more dies together.

29. The method of claim 21 wherein the at least one insulating body comprises a plurality of insulating bodies, all having their bottom metallization layer simultaneously diffusion bonded to the heat spreader's top metal surface during the step of diffusion bonding.

30. The method of claim 21 wherein at least the bottom metallization layer of the at least one insulating body comprises copper or a copper alloy.

31. The method of claim 21 further comprising polishing the bottom metallization layer of the at least one insulating body and the top metal surface of the heat spreader prior to the step of diffusion bonding.

32. The method of claim 21 wherein the heat spreader is a vapor chamber.

33. The method of claim 21 wherein the heat spreader is a solid metal plate.

34. An assembly comprising:

a heat spreader having a substantially flat top metal surface and a substantially flat bottom metal surface, the heat spreader for being thermally coupled to a heat sink;

at least one insulating body, the at least one insulating body having a top metallization layer connected to electrodes of at least one electronic device, the at least one insulating body having a bottom metallization layer; and the bottom metallization layer of the at least one insulating body being diffusion bonded to the top metal surface of the heat spreader under heat and pressure.

35. The method of claim 1 wherein the at least one insulating body comprises a ceramic submount.

36. The method of claim 1 wherein the step of providing a vapor chamber comprises providing the vapor chamber not containing a working fluid;

wherein the step of diffusion bonding comprises diffusion bonding the bottom metallization layer of the at least one insulating body to the top metal surface of the vapor chamber under heat and pressure without the working fluid being in the vapor chamber; and further comprising the step of, after the diffusion bonding step, introducing the working fluid into the vapor chamber and sealing the vapor chamber.

37. The assembly of claim 19 wherein the insulating body comprises a ceramic substrate.

38. The method of claim 21 wherein the insulating body is a ceramic submount.

* * * * *